United States Patent
Yun et al.

(10) Patent No.: US 9,780,246 B2
(45) Date of Patent: Oct. 3, 2017

(54) METHOD FOR MANUFACTURING CZTS BASED THIN FILM HAVING DUAL BAND GAP SLOPE, METHOD FOR MANUFACTURING CZTS BASED SOLAR CELL HAVING DUAL BAND GAP SLOPE AND CZTS BASED SOLAR CELL THEREOF

(71) Applicant: KOREA INSTITUTE OF ENERGY RESEARCH, Daejeon (KR)

(72) Inventors: Jae Ho Yun, Daejeon (KR); Jihye Gwak, Daejeon (KR); SeJin Ahn, Daejeon (KR); Kyung Hoon Yoon, Daejeon (KR); Kee Shik Shin, Daejeon (KR); SeoungKyu Ahn, Daejeon (KR); Ara Cho, Seoul (KR); Sang Hyun Park, Daejeon (KR); Jun Sik Cho, Daejeon (KR); Jin Su You, Seoul (KR); Joo Hyung Park, Daejeon (KR); Young Joo Eo, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 575 days.

(21) Appl. No.: 14/364,879

(22) PCT Filed: Jun. 19, 2013

(86) PCT No.: PCT/KR2013/005381
§ 371 (c)(1),
(2) Date: Jun. 12, 2014

(87) PCT Pub. No.: WO2013/191451
PCT Pub. Date: Dec. 27, 2013

(65) Prior Publication Data
US 2014/0338736 A1    Nov. 20, 2014

(30) Foreign Application Priority Data
Jun. 20, 2012 (KR) .................. 10-2012-0066111

(51) Int. Cl.
*H01L 31/0725* (2012.01)
*H01L 31/032* (2006.01)
(Continued)

(52) U.S. Cl.
CPC ...... *H01L 31/0725* (2013.01); *H01L 21/0256* (2013.01); *H01L 21/02422* (2013.01);
(Continued)

(58) Field of Classification Search
CPC ................. H01L 31/0725; H01L 31/18; H01L 21/02491; H01L 21/02474;
(Continued)

(56) References Cited

U.S. PATENT DOCUMENTS

2013/0164885 A1* 6/2013 Liang ................ H01L 21/02472
438/95
2014/0011314 A1* 1/2014 Ryu ........................ H01L 31/18
438/57
(Continued)

FOREIGN PATENT DOCUMENTS

CN    101847669 A    9/2010
CN    101800263 A    11/2010
(Continued)

OTHER PUBLICATIONS

International Preliminary Report on Patentability and Written Opinion dated Dec. 23, 2014 for corresponding International Patent Application No. PCT/KR2013/005381, filed Jun. 19, 2013.
(Continued)

*Primary Examiner* — John P Dulka
(74) *Attorney, Agent, or Firm* — Westman, Champlin & Koehler, P.A.; Amanda M. Prose (57) ABSTRACT

A method for manufacturing a CZTS based thin film having a dual band gap slope, comprising the steps of: forming a $Cu_2ZnSnS_4$ thin film layer; forming a $Cu_2ZnSn(S,Se)_4$ thin
(Continued)

film layer; and forming a $Cu_2ZnSnS_4$ thin film layer. A method for manufacturing a CZTS based solar cell having a dual band gap slope according to another aspect of the present invention comprises the steps of: forming a back contact; and forming a CZTS based thin film layer on the back contact by the method described above.

20 Claims, 7 Drawing Sheets

(51) Int. Cl.
  *H01L 21/02* (2006.01)
  *H01L 31/18* (2006.01)
(52) U.S. Cl.
  CPC .. *H01L 21/02474* (2013.01); *H01L 21/02477* (2013.01); *H01L 21/02485* (2013.01); *H01L 21/02491* (2013.01); *H01L 21/02557* (2013.01); *H01L 21/02568* (2013.01); *H01L 31/0326* (2013.01); *H01L 31/18* (2013.01); *Y02E 10/50* (2013.01)
(58) Field of Classification Search
  CPC ........... H01L 21/02477; H01L 21/0256; H01L 21/02557; H01L 21/02568; H01L 21/02485; H01L 21/02422; H01L 31/0326
  See application file for complete search history.

(56) References Cited

U.S. PATENT DOCUMENTS

| | | | | |
|---|---|---|---|---|
| 2015/0027896 A1* | 1/2015 | Kim | ......... | H01L 21/02422 205/177 |
| 2015/0303328 A1* | 10/2015 | Yun | ......... | H01L 31/0749 136/262 |
| 2016/0141434 A1* | 5/2016 | Chang | ......... | H01L 31/0326 136/256 |

FOREIGN PATENT DOCUMENTS

| | | |
|---|---|---|
| CN | 102418072 A | 4/2012 |
| JP | 2010-045305 A | 2/2010 |
| JP | 2012-059847 A | 3/2012 |
| KR | 10-2011-0116485 A | 10/2011 |
| WO | 2011/132915 A2 | 11/2010 |
| WO | 2012/055738 A2 | 3/2012 |
| WO | 2012-071289 A2 | 5/2012 |

OTHER PUBLICATIONS

Chinese Office Action dated Sep. 9, 2015 in corresponding Chinese family member application No. 201380004304.9 citing references attached.

International Search Report and Written Opinion dated Oct. 14, 2013 for corresponding International Patent No. PCT/KR2013/005381, filed Jun. 19, 2013. Application.

English Translation of the International Search Report dated Oct. 14, 2013 for corresponding International Patent Application No. PCT/KR2013/005381, filed Jun. 19, 2013.

Guo et al.: "Fabrication of 7.2% efficient CZTSSe solar cells using CZTS nanocrystals", J.Am. Chem. Soc., Nov. 19, 2010, vol. 132, No. 49, p. 17384-17386.

Contreras et al.: "High Efficiency Graded Bandgap Thin-Film Polycrystalline Cu(In,Ga)Se2-Based Solar Cells", Solar Energy Materials and Solar Cells, vol. 41/42, Jun. 10, 1996, pp. 231-246.

Lundberg et al.: "The effect of Ga-grading in CIGS thin film solar cells", Proceedings of Symposium O on Thin Film Chalcogenide Photovoltaic Materials, EMRS 2004 Conference, Strasbourg, France, May 24-28, 2004.

* cited by examiner

Forming Cu₂ZnSnS₄ thin film layer

↓

Forming Cu₂ZnSn(S,Se)₄ thin film

↓

Forming Cu₂ZnSnS₄ thin film layer

```
┌─────────────────────────────────────┐
│ Forming  precursor  thin  film      │
│ comprising Cu, Zn, and Sn           │
└─────────────────────────────────────┘
                  ↓
┌─────────────────────────────────────┐
│        Primary sulfurization        │
└─────────────────────────────────────┘
                  ↓
┌─────────────────────────────────────┐
│            Selenization             │
└─────────────────────────────────────┘
                  ↓
┌─────────────────────────────────────┐
│       Secondary sulfurization       │
└─────────────────────────────────────┘
```

```
Forming a first precursor thin
film comprising Cu, Zn, and Sn
```

↓

```
Primary sulfurization
```

↓

```
Forming a second precursor thin
film comprising Cu, Zn, and Sn
```

↓

```
Selenization
```

↓

```
Forming a Third precursor thin
film comprising Cu, Zn, and Sn
```

↓

```
Secondary sulfurization
```

METHOD FOR MANUFACTURING CZTS BASED THIN FILM HAVING DUAL BAND GAP SLOPE, METHOD FOR MANUFACTURING CZTS BASED SOLAR CELL HAVING DUAL BAND GAP SLOPE AND CZTS BASED SOLAR CELL THEREOF

CROSS-REFERENCE TO RELATED APPLICATIONS

The Application is a Section 371National Stage Application of International Application No. PCT/KR2013/005381, filed Jun. 19, 2013, published as International Publication No. WO 2013/191451; which claims priority to and the benefit of Korean Patent Application No.10-2012-0066111, filed Jun. 20, 2012.

TECHNICAL FIELD

The present invention relates to a method of manufacturing a CZTS-based thin film for use in a CZTS-based solar cell, and more particularly, to a method of manufacturing a CZTS-based thin film having a dual band gap slope to thus improve solar cell efficiency.

BACKGROUND ART

Recently, the need to develop next-generation clean energy is increasing in importance due to serious environmental pollution problems and the exhaustion of fossil energy. Especially, solar cells, which are used to directly convert solar energy into electric energy, are expected to become an energy source able to solve the energy problems of the future because they generate less pollution, utilize unlimited solar resources and have a semi-permanent lifespan.

Solar cells are classified into a variety of types depending on the material for an absorber layer. Currently, the most commonly used is a Si solar cell using Si. However, as the price of Si has drastically increased attributable to the recent Si supply shortage, thin-film solar cells are receiving attention. Thin-film solar cells are thin and enable smaller amounts of materials to be consumed, and are also light and have a wider range of utilization. Thorough research is ongoing into using amorphous Si and CdTe, CIS ($CuInSe_2$) or CIGS ($CuIn_{1-x}Ga_xSe_2$) as materials of such thin-film solar cells.

A CIS or CIGS thin film corresponds to a Group I-III-IV compound semiconductor, and exhibits the highest conversion efficiency (about 19.9%) among thin-film solar cells which have been experimentally produced. In particular, this thin film may be manufactured to a thickness of 10 μm or less and is stable even upon extended use, and is thereby expected to replace Si to thus fabricate inexpensive high-efficiency solar cells.

Furthermore, the CIS thin film is a direct transition type semiconductor and may thus be provided in the form of a thin film, and has a band gap of 1.04 eV that is comparatively adapted for light conversion, and the light absorption coefficient thereof is the greatest amongst the known solar cell materials. The CIGS thin film has been developed by replacing a portion of In with Ga or replacing Se with S to improve the low open-circuit voltage of the CIS thin film. However, the CIS or CIGS thin film has comparatively high production costs because of the use of expensive In and Ga elements, and the band gap thereof is slightly low.

In order to increase the efficiency of solar cells and achieve cost savings, novel materials and manufacturing able to further increase a band gap and to use inexpensive elements have to be devised.

As part of the recent efforts for developing novel materials to replace the In element with inexpensive elements, the preparation of a $Cu_2ZnSn(S,Se)_4$ thin film (hereinafter referred to as "CZTS-based thin film") wherein In is replaced with inexpensive Zn and Sn is under active study.

However, because the CZTS-based thin film has lower efficiency than that of the CIS or CIGS thin film, extensive and intensive research into increasing the efficiency thereof is being carried out.

Figure 6:
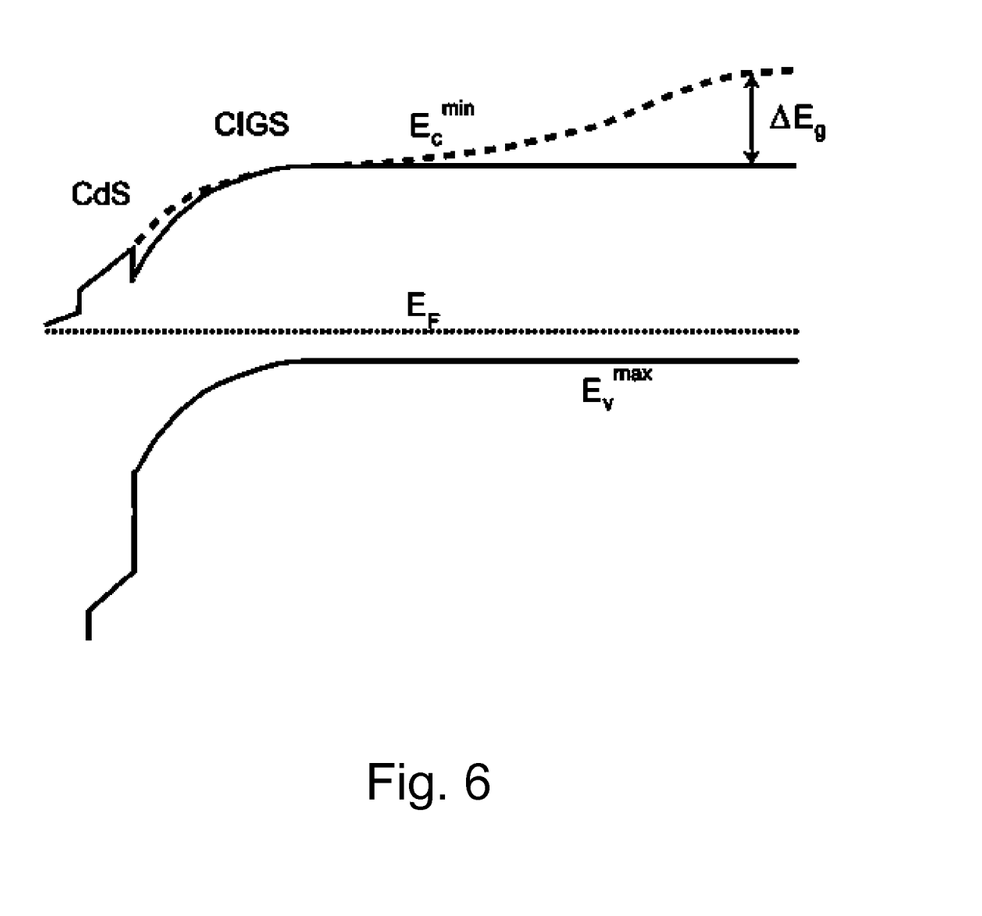
FIG. 6 is a graph illustrating changes in band gap depending on changes in the Ga proportion in the CIGS thin film.

Meanwhile, because the conduction band of the CIGS thin film is determined by a bonding relation of Ga and In, the band gap may be changed by way of changing the Ga/(In+Ga) ratio ("The effect of Ga-grading in CIGS thin film solar cells", Thin Solid Films, Volumes 480-481, 1 Jun. 2005, Pages 520-525), and FIG. 6 is a graph illustrating changes in band gap depending on changes in the Ga proportion in the CIGS thin film.

Moreover, the band gap of CIGS may be controlled by adjusting the Ga proportion, and thereby the Ga and In proportions are changed in the course of preparation of the CIGS thin film, thus increasing the efficiency of the CIGS thin-film solar cell using a double grading structure in which a double band gap slope is imparted in the CIGS thin film.

Figure 7:
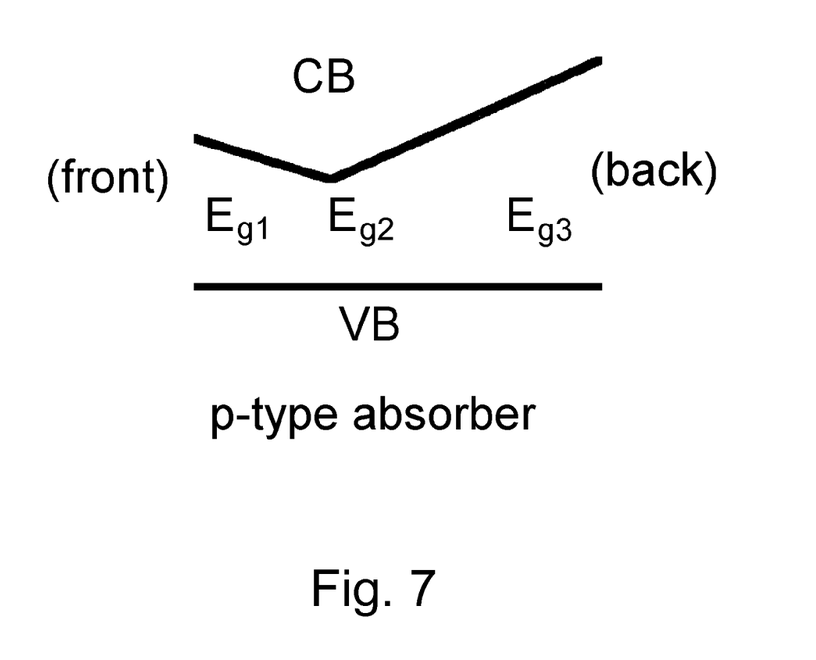
FIG. 7 is a schematic view illustrating the case where a double band gap slope is formed in the CIGS thin film.

FIG. 7 schematically illustrates the case where a double band gap slope is formed in a CIGS thin film ("High efficiency graded bandgap thin-film polycrystalline Cu(In,Ga)$Se_2$-based solar cells", Solar Energy Materials and Solar Cells 41/42 (1996) 231-246).

When the band gap of the front side of the CIGS thin film is higher than that of the center thereof, open-circuit voltage may increase and recombination may be reduced. Also, when the band gap of the back side of the CIGS thin film is higher than that of the center thereof, electron mobility may increase.

However, the CZTS thin film is disadvantageous because the band gap of the CZTS-based thin film cannot be changed by way of changing the Zn/Sn ratio, making it impossible to attain improvements in solar cell efficiency through the double grading structure.

CITATION LIST

1. "The effect of Ga-grading in CIGS thin film solar cells", Thin Solid Films, Volumes 480-481, 1 Jun. 2005, Pages 520-525
2. "High efficiency graded bandgap thin-film polycrystalline Cu(In,Ga)Se2-based solar cells", Solar Energy Materials and Solar Cells 41/42 (1996) 231-246

DISCLOSURE

Technical Problem

The present invention has been made keeping in mind the above problems encountered in the related art, and an object of the present invention is to provide a method of manufacturing a CZTS-based thin film having a double band gap slope, a method of manufacturing a CZTS-based solar cell having a double band gap slope, and a CZTS-based solar cell.

Technical Solution

In order to accomplish the above object, an aspect of the present invention provides a method of manufacturing a CZTS-based thin film having a dual band gap slope, comprising forming a $Cu_2ZnSnS_4$ thin film layer; forming a $Cu_2ZnSn(S,Se)_4$ thin film layer; and forming a $Cu_2ZnSnS_4$ thin film layer.

The present inventors have noticed changes in the band gap depending on the amounts of S and Se contained in the CZTS-based thin film and thus have devised a method of manufacturing a CZTS-based thin film having a double band gap slope by sequentially forming a $Cu_2ZnSnS_4$ thin film layer, a $Cu_2ZnSn(S,Se)_4$ thin film layer and a $Cu_2ZnSnS_4$ thin film layer.

Specifically, the present invention may comprise synthesizing a precursor thin film layer comprising Cu, Zn and Sn; subjecting the precursor thin film layer to primary sulfurization; selenizing the sulfurized thin film layer; and subjecting the selenized thin film layer to secondary sulfurization.

In addition, the present invention may comprise synthesizing a precursor thin film layer comprising Cu, Zn, Sn and S; selenizing the precursor thin film layer; and sulfurizing the selenized thin film layer.

Furthermore, the present invention may comprise synthesizing a first precursor thin film layer comprising Cu, Zn and Sn; subjecting the first precursor thin film layer to primary sulfurization; synthesizing a second precursor thin film layer comprising Cu, Zn and Sn on the sulfurized thin film layer; selenizing the second precursor thin film layer; synthesizing a third precursor thin film layer comprising Cu, Zn and Sn on the selenized thin film layer; and subjecting the third precursor thin film layer to secondary sulfurization.

In the present invention, synthesizing the precursor thin film is preferably performed using any one process selected from among co-evaporation, sputtering, electrodeposition, nanoparticle deposition and solution coating.

Also, sulfurization is preferably performed by thermal treatment in an $H_2S$ atmosphere or injection of S into a thin film using a vacuum evaporation process, and selenization is preferably carried out by thermal treatment in an $H_2Se$ atmosphere or injection of Se into a thin film using a vacuum evaporation process.

Another aspect of the present invention provides a method of manufacturing a CZTS-based solar cell having a dual band gap slope, comprising forming a back contact; and forming, on the back contact, a CZTS-based thin film layer using any one method among the above methods.

A further aspect of the present invention provides a CZTS-based solar cell, comprising a back contact; and a CZTS-based thin film layer formed on the back contact, wherein the CZTS-based thin film layer comprises a $Cu_2ZnSnS_4$ thin film layer, a $Cu_2ZnSn(S,Se)_4$ thin film layer and a $Cu_2ZnSnS_4$ thin film layer which are sequentially formed, and the band gap energy of the $Cu_2ZnSn(S,Se)_4$ thin film layer is lower than that of the $Cu_2ZnSnS_4$ thin film layer.

According to the present invention, the CZTS-based solar cell includes a CZTS-based thin film layer having a dual band gap slope by adjusting the S and Se proportions, and the band gap of the front side of the CZTS-based thin film layer is higher to thus increase open-circuit voltage and reduce recombination, and the band gap of the back side of the CZTS-based thin film layer is higher to thus increase electron mobility, ultimately improving the efficiency of the solar cell.

Such a CZTS-based solar cell is preferably configured such that the $Cu_2ZnSn(S,Se)_4$ thin film layer is thicker than the $Cu_2ZnSnS_4$ thin film layer.

Advantageous Effects

According to the present invention, a $Cu_2ZnSnS_4$ thin film layer, a $Cu_2ZnSn(S,Se)_4$ thin film layer and a $Cu_2ZnSnS_4$ thin film layer are sequentially formed, and thereby the band gap of the $Cu_2ZnSn(S,Se)_4$ thin film layer positioned therebetween is low, thus effectively forming a double band gap slope.

Also, a CZTS-based thin film layer having a dual band gap slope has a high band gap at the front side thereof, thus increasing open-circuit voltage and reducing recombination, and has a high band gap at the back side thereof, thus increasing electron mobility, thereby improving efficiency of solar cells.

DESCRIPTION OF THE REFERENCE
NUMERALS IN THE DRAWINGS

100: substrate 200: back contact
300: CZTS-based thin film layer

MODE FOR INVENTION

Hereinafter, a detailed description will be given of embodiments of the present invention with reference to the appended drawings.

Figure 1:
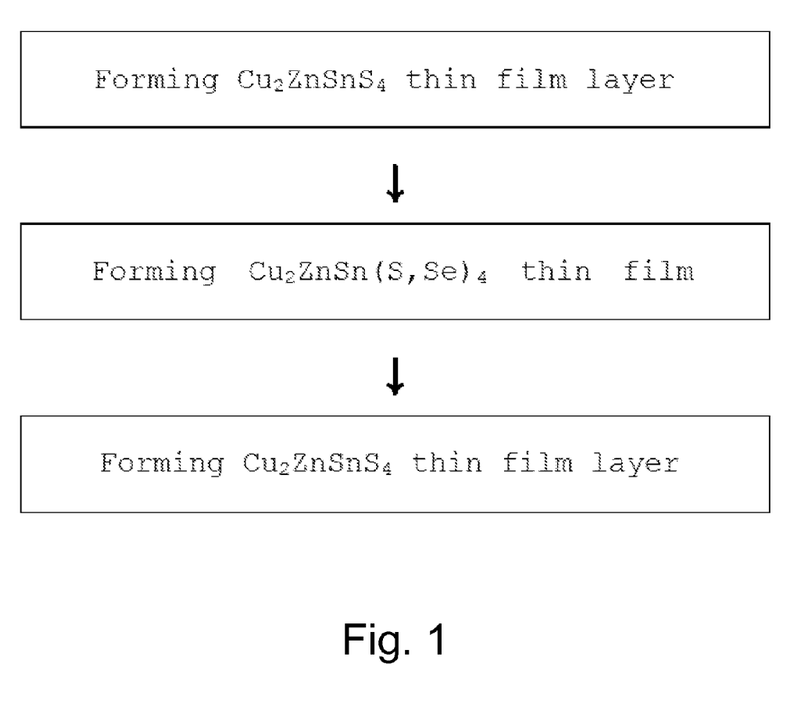
FIG. 1 is a flowchart illustrating a process of manufacturing a CZTS-based thin film according to the present invention.
Figure 2:
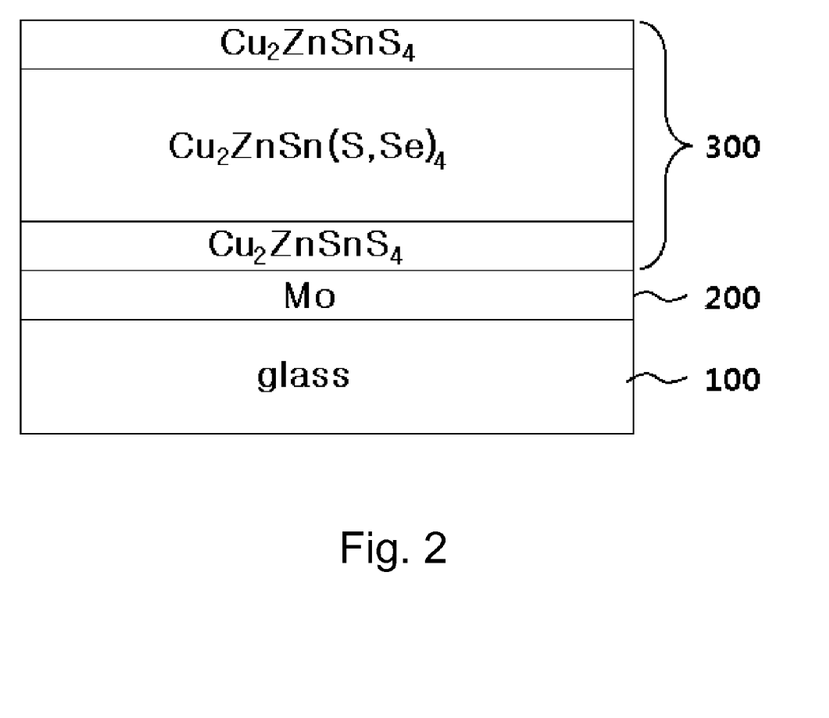
FIG. 2 is a schematic view illustrating the structure of a CZTS-based thin film layer formed according to the present invention.

FIG. 1 is a flowchart illustrating a process of manufacturing a CZTS-based thin film according to the present invention, and FIG. 2 is a schematic view illustrating the structure of a CZTS-based thin film layer according to the present invention.

In order to form a CZTS-based thin film having a double band gap slope according to the present invention, as illustrated in FIG. 1, a $Cu_2ZnSnS_4$ thin film layer, a $Cu_2ZnSn(S,Se)_4$ thin film layer and a $Cu_2ZnSnS_4$ thin film layer are sequentially formed.

As illustrated in FIG. 2, a CZTS-based thin film layer 300 is provided on a Mo back contact 200 on a glass substrate 100, the CZTS-based thin film layer comprising a $Cu_2ZnSnS_4$ thin film layer, a $Cu_2ZnSn(S,Se)_4$ thin film layer and a $Cu_2ZnSnS_4$ thin film layer which are sequentially formed.

The band gap of $Cu_2ZnSnS_4$ is known to fall in the range of 1.32~1.85 eV, the band gap of $Cu_2ZnSnSe_4$ approximates to 1.02 eV lower than that, and the band gap of $Cu_2ZnSn(S,Se)_4$ is positioned therebetween.

Therefore, the CZTS-based thin film layer 300 having the above layer configuration according to the present invention has a high band gap at the front side and the back contact 200 side and has a low band gap therein, and thus the CZTS-based thin film layer 300 having a dual band gap slope formed therein toward the front side and the back contact side may be formed.

Furthermore, it is preferable that the $Cu_2ZnSn(S,Se)_4$ thin film layer typically known to have excellent photoelectric conversion efficiency be thicker than the $Cu_2ZnSnSe_4$ thin film layer.

According to the present invention, the CZTS-based solar cell has to further include a front reflective layer or a front contact in addition to the structure of FIG. 2, but such a typical configuration may be applied without particular limitation and a detailed description thereof is omitted.

Specific examples for sequentially forming the $Cu_2ZnSnS_4$ thin film layer, the $Cu_2ZnSn(S,Se)_4$ thin film layer and the $Cu_2ZnSnS_4$ thin film layer are described below.

EXAMPLE 1

Figure 3:
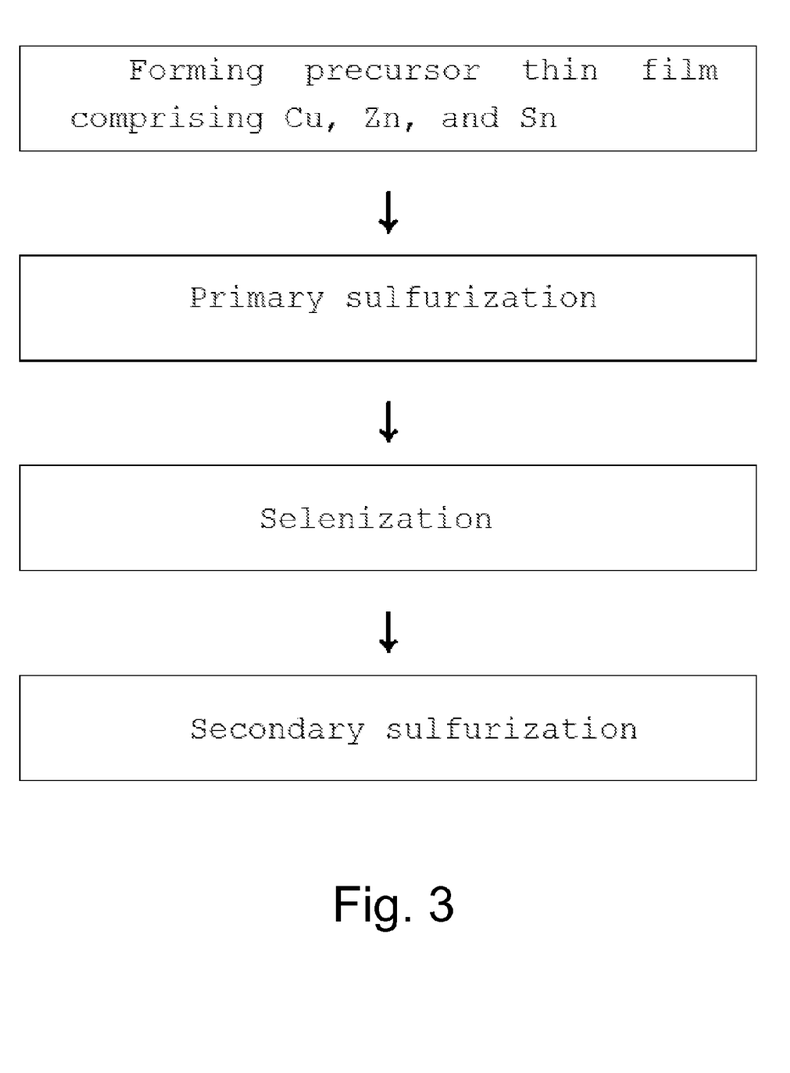
FIG. 3 is a flowchart illustrating a process of manufacturing a CZTS-based thin film according to a first embodiment of the present invention.

FIG. 3 is a flowchart illustrating a process of manufacturing a CZTS-based thin film according to a first embodiment of the present invention.

In accordance with the first embodiment, a CZTS-based thin film comprising a $Cu_2ZnSnS_4$ thin film layer, a $Cu_2ZnSn(S,Se)_4$ thin film layer and a $Cu_2ZnSnS_4$ thin film layer which are sequentially formed is provided, by forming a precursor thin film comprising Cu, Zn and Sn, and sequentially subjecting the precursor thin film to primary sulfurization, selenization and secondary sulfurization.

Specifically, the precursor thin film comprising Cu, Zn and Sn is first formed.

Although formation of the precursor thin film is typically carried out using a co-evaporation process, any process such as sputtering, electrodeposition, nanoparticle deposition and solution coating may be applied.

Because the precursor thin film of the present embodiment is formed into the CZTS-based thin film through sulfurization and selenization, it has to be formed to a thickness of 0.5~2 μm.

The Cu—Zn—Sn precursor thin film thus formed is subjected to primary sulfurization, thus forming $Cu_2ZnSnS_4$. Examples of the sulfurization process may include thermal treatment in an $H_2S$ atmosphere, and thermal treatment after injection of S into a precursor thin film using a vacuum evaporation process.

Such thermal treatment is performed under conditions of a substrate temperature of 400~530° C. and a pressure of 1 mtorr~300 torr for 1~20 min.

The thin film subjected to primary sulfurization is selenized to give $Cu_2ZnSn(S,Se)_4$. Examples of the selenization process may include thermal treatment in an $H_2Se$ atmosphere, and thermal treatment after injection of Se into a precursor thin film using a vacuum evaporation process.

Such thermal treatment is performed under conditions of a substrate temperature of 400~530° C. and a pressure of 1 mtorr~300 torr for 1~20 min.

Finally, the selenized thin film is subjected to secondary sulfurization, thus forming $Cu_2ZnSnS_4$. Examples of the sulfurization process may include thermal treatment in an $H_2S$ atmosphere, and thermal treatment after injection of S into a precursor thin film using a vacuum evaporation process.

Thermal treatment is implemented under conditions of a substrate temperature of 400~530° C. and a pressure of 1 mtorr~300 torr for 1~20 min.

EXAMPLE 2

Figure 4:
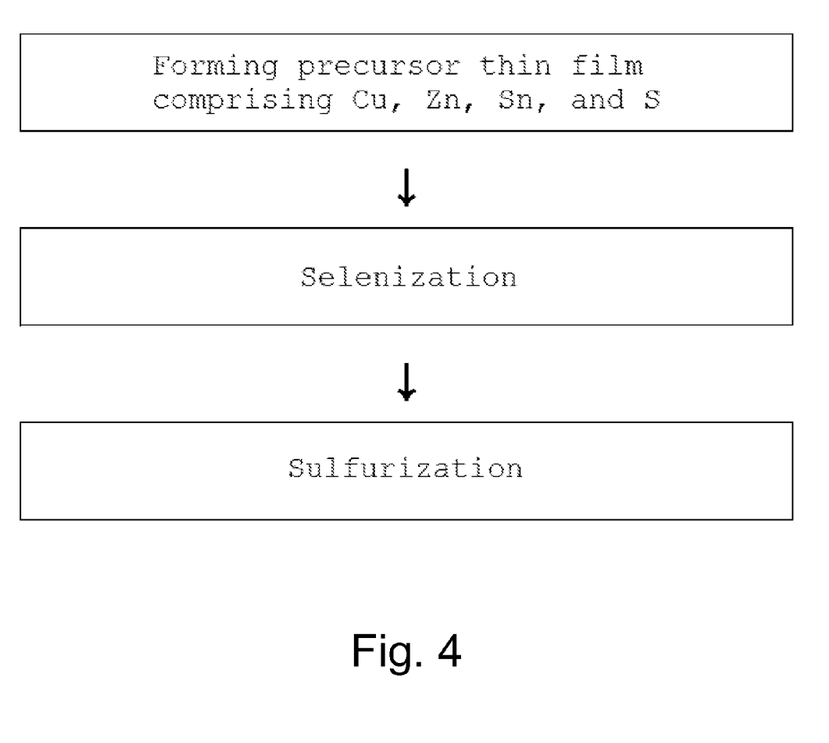
FIG. 4 is a flowchart illustrating a process of manufacturing a CZTS-based thin film according to a second embodiment of the present invention.

FIG. 4 is a flowchart illustrating a process of manufacturing a CZTS-based thin film according to a second embodiment of the present invention.

In accordance with the second embodiment, a CZTS-based thin film comprising a $Cu_2ZnSnS_4$ thin film layer, a $Cu_2ZnSn(S,Se)_4$ thin film layer and a $Cu_2ZnSnS_4$ thin film layer which are sequentially formed is provided, by forming a precursor thin film comprising Cu, Zn, Sn and S and sequentially subjecting the precursor thin film to selenization and sulfurization.

Specifically, the precursor thin film comprising Cu, Zn, Sn and S is first formed. This embodiment is different in terms of containing S at the step of forming the precursor thin film from the first embodiment.

The precursor thin film is typically formed using a co-evaporation process, but any process such as sputtering, electrodeposition, nanoparticle deposition and solution coating may be applied.

Because the precursor thin film of the present embodiment is formed into the CZTS-based thin film through selenization and sulfurization, it has to be formed to a thickness of 0.5~2 μm.

The Cu—Zn—Sn—S precursor thin film thus formed is selenized, thus forming $Cu_2ZnSnS_4$ and $Cu_2ZnSn(S,Se)_4$.

Because S is contained in the precursor thin film, it is possible to form the structure in which $Cu_2ZnSnS_4$ and $Cu_2ZnSn(S,Se)_4$ are sequentially positioned through selenization, without performing sulfurization. Examples of the selenization process may include thermal treatment in an $H_2Se$ atmosphere, and thermal treatment after injection of Se into a precursor thin film using a vacuum evaporation process.

Such thermal treatment is performed under conditions of a substrate temperature of 400~530° C. and a pressure of 1 mtorr~300 torr for 1~20 min.

Finally, the selenized thin film is subjected to secondary sulfurization, thus forming $Cu_2ZnSnS_4$. Examples of the sulfurization process may include thermal treatment in an $H_2S$ atmosphere, and thermal treatment after injection of S into a precursor thin film using a vacuum evaporation process.

Thermal treatment is implemented under conditions of a substrate temperature of 400~530° C. and a pressure of 1 mtorr~300 torr for 1~20 min.

EXAMPLE 3

Figure 5:
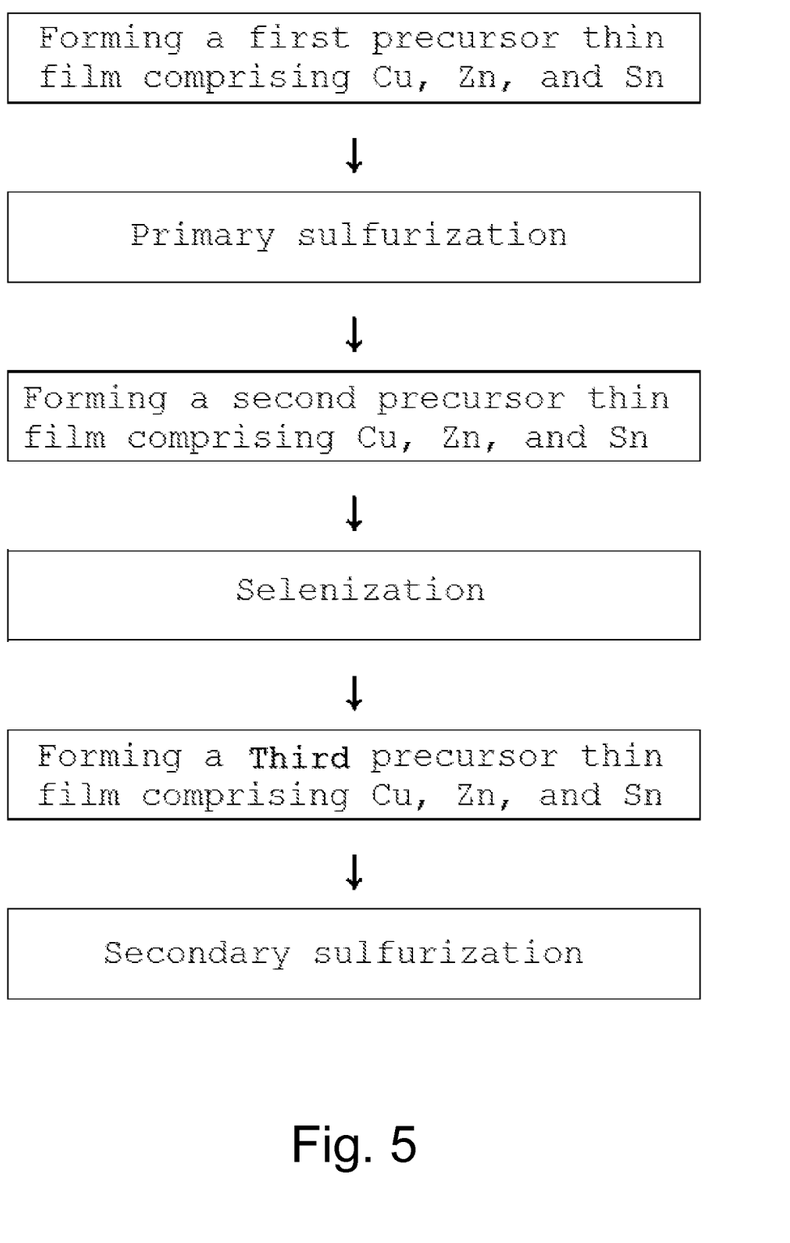
FIG. 5 is a flowchart illustrating a process of manufacturing a CZTS-based thin film according to a third embodiment of the present invention.

FIG. 5 is a flowchart illustrating a process of manufacturing a CZTS-based thin film according to a third embodiment of the present invention.

In accordance with the third embodiment, a CZTS-based thin film comprising a $Cu_2ZnSnS_4$ thin film layer, a $Cu_2ZnSn(S,Se)_4$ thin film layer and a $Cu_2ZnSnS_4$ thin film layer which are sequentially formed is provided, by forming three precursor thin films comprising Cu, Zn and Sn, and sequentially subjecting respective precursor thin films to primary sulfurization, selenization and secondary sulfurization.

Specifically, a first precursor thin film comprising Cu, Zn and Sn is formed above all.

The first precursor thin film is typically formed using a co-evaporation process, but any process such as sputtering, electrodeposition, nanoparticle deposition and solution coating may be applied.

Because the first precursor thin film of the present embodiment is formed into the $Cu_2ZnSnS_4$ thin film layer through sulfurization, it is formed to be thin to the extent of 0.1~0.5 μm.

The first precursor thin film thus formed is subjected to primary sulfurization, thus forming the $Cu_2ZnSnS_4$ thin film layer. Examples of the sulfurization process may include thermal treatment in an $H_2S$ atmosphere, and thermal treatment after injection of S into a precursor thin film using a vacuum evaporation process. Such thermal treatment is performed under conditions of a substrate temperature of 400~530° C. and a pressure of 1 mtorr~300 torr for 1~20 min.

Provided on the $Cu_2ZnSnS_4$ thin film layer is a second precursor thin film comprising Cu, Zn and Sn. The second precursor thin film is formed in the same manner as in the first precursor thin film, and a description thereof is omitted. However, because the second precursor thin film is formed into the $Cu_2ZnSn(S,Se)_4$ thin film layer through selenization, its thickness is set to 0.5~1 μm.

The second precursor thin film is selenized to give the $Cu_2ZnSn(S,Se)_4$ thin film layer. Examples of the selenization process may include thermal treatment in an $H_2Se$ atmosphere, and thermal treatment after injection of Se into a precursor thin film using a vacuum evaporation process. Such thermal treatment is performed under conditions of a substrate temperature of 400~530° C. and a pressure of 1 mtorr~300 torr for 1~20 min.

Provided on the $Cu_2ZnSn(S,Se)_4$ thin film layer is a third precursor thin film comprising Cu, Zn and Sn. The formation process and the thickness of the third precursor thin film are the same as in the first precursor thin film, and a description thereof is omitted.

The third precursor thin film thus formed is subjected to secondary sulfurization, thus forming the $Cu_2ZnSnS_4$ thin film layer. Examples of the sulfurization process may include thermal treatment in an $H_2S$ atmosphere, and thermal treatment after injection of S into a precursor thin film using a vacuum evaporation process. Furthermore, thermal treatment is conducted under conditions of a substrate temperature of 400~530° C. and a pressure of 1 mtorr~300 torr for 1~20 min.

The third embodiment is performed in such a manner that three precursor thin films are formed and each precursor thin film is subjected to sulfurization or selenization, and is thus different from the other embodiments. Although the third embodiment has more complicated processes compared to the other embodiments, it makes it easy to adjust the thickness of the $Cu_2ZnSnS_4$ thin film layer and the $Cu_2ZnSn(S,Se)_4$ thin film layer, thus facilitating the formation of the structure wherein the $Cu_2ZnSn(S,Se)_4$ thin film layer is thicker than the $Cu_2ZnSnS_4$ thin film layer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, the scope of the present invention should be understood not by specific embodiments but by claims, and all technical ideas equivalent thereto will be understood to be incorporated into the scope of the present invention.

The invention claimed is:

1. A CZTS-based solar cell, comprising:
   a back contact; and
   a CZTS-based thin film layer formed on the back contact;
   wherein the CZTS-based thin film layer comprises a first $Cu_2ZnSnS_4$ thin film layer, a $Cu_2ZnSn(S,Se)_4$ thin film layer, and a second $Cu_2ZnSnS_4$ thin film layer which are sequentially formed, and a band gap energy of the $Cu_2ZnSn(S,Se)_4$ thin film layer is lower than those of the first $Cu_2ZnSnS_4$ thin film layer and the second $Cu_2ZnSnS_4$ thin film layer.

2. The CZTS-based solar cell of claim 1, wherein the $Cu_2ZnSn(S,Se)_4$ thin film layer is thicker than the first $Cu_2ZnSnS_4$ thin film layer and the second $Cu_2ZnSnS_4$ thin film layer.

3. A method of manufacturing a CZTS-based thin film having a dual band gap slope, comprising:
   forming a first $Cu_2ZnSnS_4$ thin film layer;
   forming a $Cu_2ZnSn(S,Se)_4$ thin film layer on the first $Cu_2ZnSnS_4$ thin film layer; and
   forming a second $Cu_2ZnSnS_4$ thin film layer on the $Cu_2ZnSn(S,Se)_4$ thin film layer.

4. The method of claim 3, wherein:
   forming the first $Cu_2ZnSnS_4$ thin film layer comprises:
      synthesizing a precursor thin film layer comprising Cu, Zn and Sn; and
      subjecting the precursor thin film layer to primary sulfurization;
   forming the $Cu_2ZnSn(S,Se)_4$ thin film layer comprises selenizing the sulfurized thin film layer; and
   forming the second $Cu_2ZnSnS_4$ thin film layer comprises subjecting the selenized thin film layer to secondary sulfurization.

5. The method of claim 4, wherein the synthesizing the precursor thin film layer is performed using any one process selected from among co-evaporation, sputtering, electrodeposition, nanoparticle deposition and solution coating.

6. The method of claim 4, wherein the primary sulfurization and the secondary sulfurization are performed by thermal treatment in an $H_2S$ atmosphere or injection of S into a thin film using a vacuum evaporation process.

7. The method of claim 4, wherein the selenizing is performed by thermal treatment in an $H_2Se$ atmosphere or injection of Se into a thin film using a vacuum evaporation process.

8. The method of claim 3, wherein:
   forming the first $Cu_2ZnSnS_4$ thin film layer comprises synthesizing a precursor thin film layer comprising Cu, Zn, Sn and S;
   forming the $Cu_2ZnSn(S,Se)_4$ thin film layer comprises selenizing the precursor thin film layer; and
   forming the second $Cu_2ZnSnS_4$ thin film layer comprises sulfurizing the selenized thin film layer.

9. The method of claim 8, wherein the synthesizing the precursor thin film layer is performed using any one process selected from among co-evaporation, sputtering, electrodeposition, nanoparticle deposition and solution coating.

10. The method of claim 8, wherein the selenizing is performed by thermal treatment in an $H_2Se$ atmosphere or injection of Se into a thin film using a vacuum evaporation process.

11. The method of claim 8, wherein the sulfurizing is performed by thermal treatment in an $H_2S$ atmosphere or injection of S into a thin film using a vacuum evaporation process.

12. The method of claim 3, wherein:
forming the first $Cu_2ZnSnS_4$ thin film layer comprises:
  synthesizing a first precursor thin film layer comprising Cu, Zn and Sn; and
  subjecting the first precursor thin film layer to primary sulfurization;
forming the $Cu_2ZnSn(S,Se)_4$ thin film layer comprises:
  synthesizing a second precursor thin film layer comprising Cu, Zn and Sn on the sulfurized thin film layer; and
  selenizing the second precursor thin film layer; and
forming the second $Cu_2ZnSnS_4$ thin film layer comprises:
  synthesizing a third precursor thin film layer comprising Cu, Zn and Sn on the selenized thin film layer; and
  subjecting the third precursor thin film layer to secondary sulfurization.

13. The method of claim 12, wherein the synthesizing the first to third precursor thin film layers is performed using any one process selected from among co-evaporation, sputtering, electrodeposition, nanoparticle deposition and solution coating.

14. The method of claim 12, wherein the primary sulfurization and the secondary sulfurization are performed by thermal treatment in an $H_2S$ atmosphere or injection of S into a thin film using a vacuum evaporation process.

15. The method of claim 12, wherein the selenizing is performed by thermal treatment in an $H_2Se$ atmosphere or injection of Se into a thin film using a vacuum evaporation process.

16. A method of manufacturing a CZTS-based solar cell having a dual band gap slope, comprising:
forming a back contact; and
forming a CZTS-based thin film layer, which comprise the steps of:
  forming a first $Cu_2ZnSnS_4$ thin film layer on the back contact;
  forming a $Cu_2ZnSn(S,Se)_4$ thin film layer on the first $Cu_2ZnSnS_4$ thin film layer; and
  forming a second $Cu_2ZnSnS_4$ thin film layer on the $Cu_2ZnSn(S,Se)_4$ thin film layer.

17. The method of claim 16, wherein:
forming the first $Cu_2ZnSnS_4$ thin film layer comprises:
  synthesizing a precursor thin film layer comprising Cu, Zn and Sn; and
  subjecting the precursor thin film layer to primary sulfurization;
forming the $Cu_2ZnSn(S,Se)_4$ thin film layer comprises selenizing the sulfurized thin film layer; and
forming the second $Cu_2ZnSnS_4$ thin film layer comprises subjecting the selenized thin film layer to secondary sulfurization.

18. The method of claim 17, wherein the synthesizing the precursor thin film layer is performed using any one process selected from among co-evaporation, sputtering, electrodeposition, nanoparticle deposition and solution coating.

19. The method of claim 17, wherein the primary sulfurization and the secondary sulfurization are performed by thermal treatment in an $H_2S$ atmosphere or injection of S into a thin film using a vacuum evaporation process.

20. The method of claim 17, wherein the selenizing is performed by thermal treatment in an $H_2Se$ atmosphere or injection of Se into a thin film using a vacuum evaporation process.

* * * * *